United States Patent
Kiyono et al.

(10) Patent No.: US 7,960,968 B2
(45) Date of Patent: Jun. 14, 2011

(54) TESTING METHOD OF MAGNETIC HEAD BY USING INDUCTANCE

(75) Inventors: Hiroshi Kiyono, Tokyo (JP); Takahiro Mori, Tokyo (JP)

(73) Assignee: TDK Corporation, Tokyo (JP)

( * ) Notice: Subject to any disclaimer, the term of this patent is extended or adjusted under 35 U.S.C. 154(b) by 714 days.

(21) Appl. No.: 12/102,569

(22) Filed: Apr. 14, 2008

(65) Prior Publication Data

US 2009/0256557 A1    Oct. 15, 2009

(51) Int. Cl.
G01R 33/12 (2006.01)
G11B 5/127 (2006.01)

(52) U.S. Cl. ................. 324/210; 29/603.09
(58) Field of Classification Search .......... 324/210–213; 29/603.09
See application file for complete search history.

(56) References Cited

U.S. PATENT DOCUMENTS

2002/0006018 A1* 1/2002 Narumi et al. ............... 360/317
2006/0191127 A1* 8/2006 Goubau et al. ............. 29/603.01

FOREIGN PATENT DOCUMENTS

| JP | A 03-132911 | 6/1991 |
| JP | A 09-180138 | 7/1997 |
| JP | A 2000-207710 | 7/2000 |

* cited by examiner

Primary Examiner — Bot L LeDynh
(74) Attorney, Agent, or Firm — Oliff & Berridge, PLC

(57) ABSTRACT

It is an object of the present invention to provide a method for investigating magnetic domains, the method capable of easily grasping behavior of the magnetic domains in a head manufacturing process, and further to provide a testing method of a magnetic head capable of evaluating whether the writing performance of the magnetic head is good or not. The method for investigating magnetic domains comprises supplying direct current (DC) to a coil of an electromagnetic transducer provided in a magnetic head for writing data onto a magnetic recording medium; measuring an inductance of the electromagnetic transducer at each current value while varying the current value of the direct current; and investigating behavior of magnetic domains in a magnetic core of the electromagnetic transducer based on a relationship between the current values and the inductances. The testing method of a magnetic head comprises evaluating whether writing performance of the magnetic head is good or not, based on a relationship between the current values and the inductances.

19 Claims, 9 Drawing Sheets

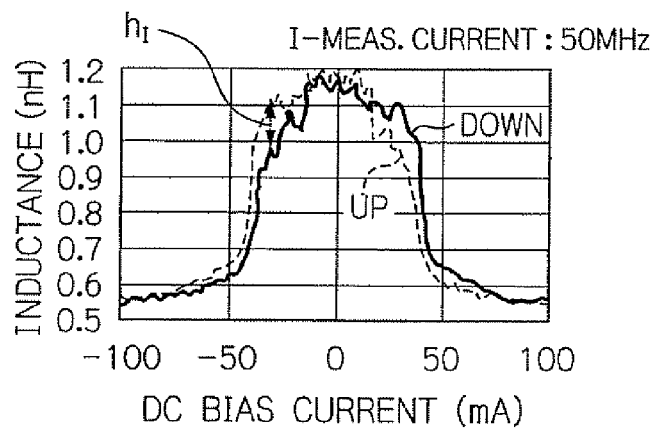
Fig. 3a
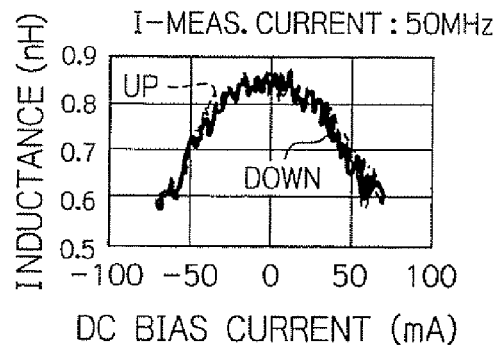
Fig. 3b1
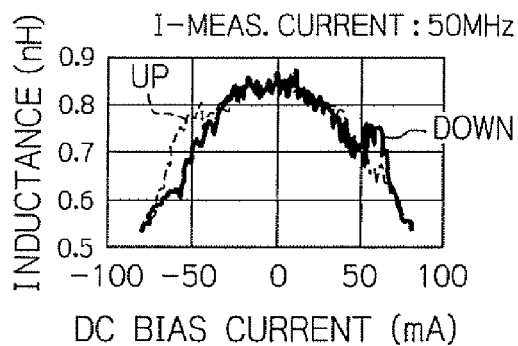
Fig. 3b2
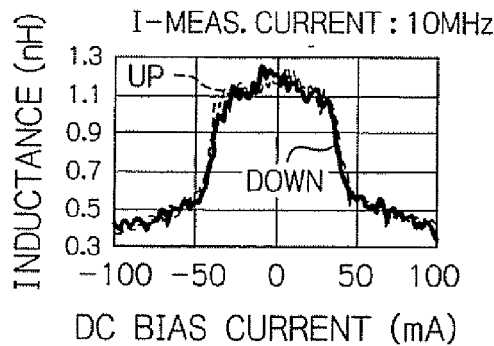
Fig. 3c1
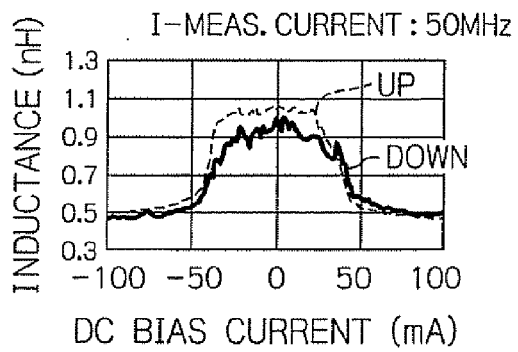
Fig. 3c2

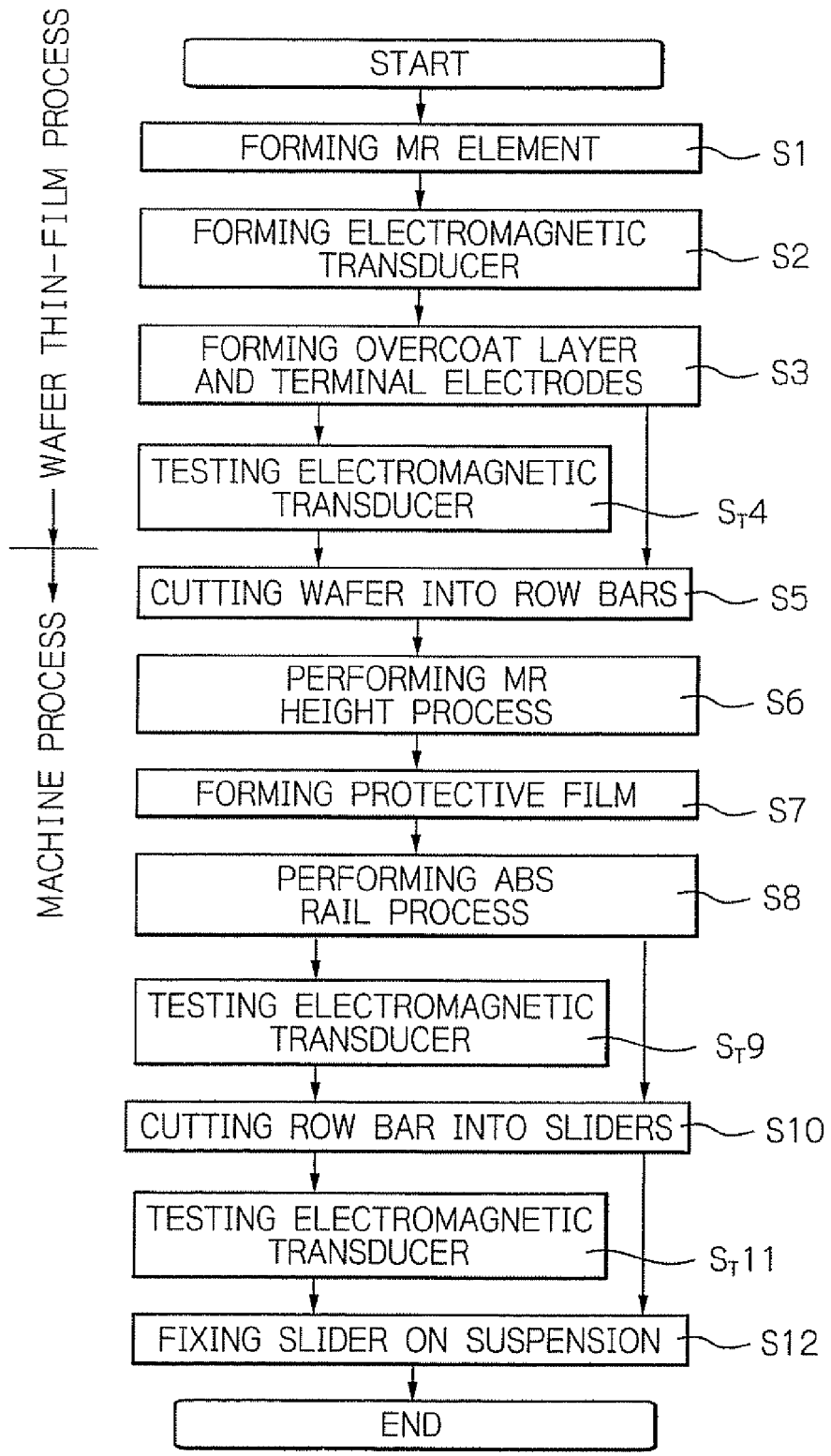

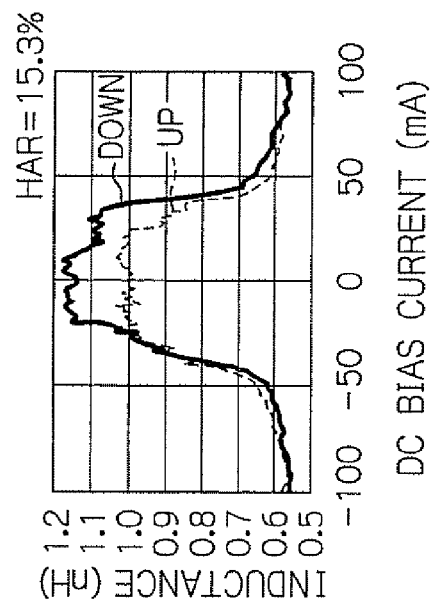
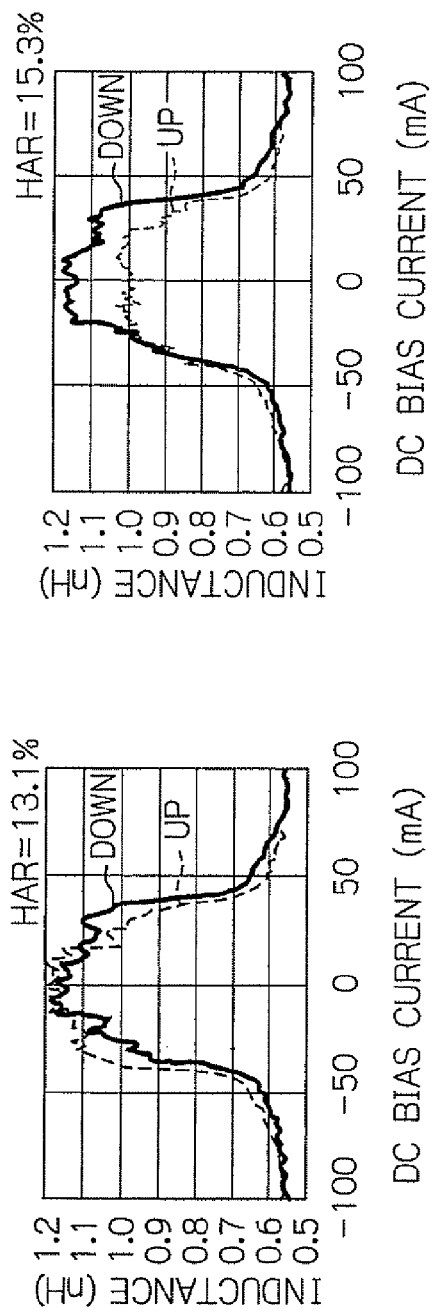
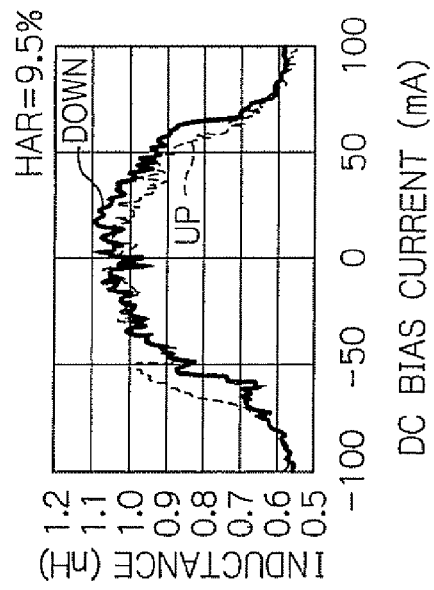

TESTING METHOD OF MAGNETIC HEAD BY USING INDUCTANCE

BACKGROUND OF THE INVENTION

1. Field of the Invention

The present invention relates to a testing method of writing performance in a thin-film magnetic head having an electromagnetic transducer for writing data onto a magnetic recording medium. Further, the invention relates to a method for investigating behavior of magnetic domains in this electromagnetic transducer. Furthermore, the invention relates to a manufacturing method of a thin-film magnetic head for selecting a head using this testing method.

2. Description of the Related Art

Recently, there has been a growing demand for improvement of read/write characteristics of a thin-film magnetic head to achieve improvement of surface recording density in a magnetic recording/reproducing device, particularly in a hard disk drive. Regarding the read characteristic, development of magnetoresistive (MR) elements, using giant magnetoresistive (GMR) effect or tunnel magnetoresistive (TMR) effect, have been actively promoted. The MR element has been actually utilized as a read head element, and contributed remarkably to improvement of the surface recording density.

On the other hand, for the write characteristic, it has been a pressing need to improve the performance of a conventionally used electromagnetic transducer having a coil and a magnetic core. One of serious problems for the improvement is reduction of inductance of the electromagnetic transducer. Particularly, in order to improve the surface recording density, it is necessary to use a higher frequency of write current flowing through a write coil, and corresponding to this necessity, the inductance has to be small enough. As an example in which reduction of inductance has been achieved, Japanese Patent Publication No. 2000-207710A discloses a thin-film magnetic head. In this patent, a write coil layer is formed on a planarized surface with a lower core layer formed in a small size, whereby the write coil layer is formed properly and the inductance is reduced at the same time.

Japanese Patent Publication No. 03-132911A discloses a method. In this document, inductance of a write coil layer in a thin-film magnetic head is measured in both cases that a strong magnetic field is applied and not applied, respectively, and it is determined based on a difference between the measured values whether the head is good or not. For applying this method, a means of generating the strong magnetic field is necessitated. Moreover, Japanese Patent Publication No. 09-180138A discloses a testing method of an MR element to achieve accuracy of determination as to whether the MR element is good or not, by obtaining resistance vs. magnetic field characteristics of the MR element while write current is supplied to the electromagnetic transducer.

However, even if above-mentioned technologies are used, it has been difficult in the past to solve another important problem for improving performance of an electromagnetic transducer, that is, to control magnetic domains of a magnetic core. Actually, even in heads manufactured under the same manufacturing method with the same specification, some heads had a defect associated with the magnetic domains of the magnetic core, which has caused a reduced yield. The inventors of the present invention wrote data on a magnetic recording medium using electromagnetic transducers, and measured each bit error rate (BER) when the written data were read using an MR element. As a result, we found that a head, having a higher BER than a determination reference level, had a lowered writing performance and appeared to have abnormality in behavior of magnetic domains of the magnetic core at the time of the measurement.

However, it is very difficult to observe the magnetic domains of a magnetic core in a manufacturing process of a head because the observation requires spending a lot of time and labor. Accordingly, the determination as to whether the head is good or not, associated with the BER described above, can be made only when the head is finally mounted on a suspension to assemble a head gimbal assembly (HGA) and writing on a magnetic recording medium is performed. This means that a whole HGA, in which a defective head is incorporated, is disposed to thereby largely reduce the yield of the whole HGA. Moreover, such determination itself spends a lot of time and labor. Furthermore, this increases disposal of value-added HGAs.

BRIEF SUMMARY OF THE INVENTION

It is therefore an object of the present invention to provide a method for investigating magnetic domains, the method capable of easily grasping behavior of the magnetic domains in a head manufacturing process, and further to provide a testing method of a magnetic head capable of evaluating whether the writing performance of the magnetic head is good or not. Yet another object of the present invention is to provide a manufacturing method of a magnetic head, the method capable of selecting a head by using such a testing method.

Before describing the present invention, terms used herein will be defined. In a multilayer structure of element(s) formed on/above an element formation surface of the substrate in a magnetic head, a layer located on the substrate side in relation to a standard layer is referred to as being located "lower" than, "beneath" or "below" the standard layer, and a portion on the substrate side of a layer is referred to as a "lower" portion. Further, a layer located on the stacking direction side (the opposite side to the substrate) in relation to a standard layer is referred to as being located "upper" than, "on" or "above" the standard layer, and a portion on the stacking direction side of a layer is referred to as an "upper" portion.

An "upper" side in a recording head means herein a trailing side, that is, a downstream side when movement of a magnetic recording medium relative to the head is regarded as one flow, and a "lower" side means a leading side, that is, an upstream side when the movement of a magnetic recording medium relative to the head is regarded as one flow.

According to the present invention, a method for investigating behavior of magnetic domains is provided, the method comprising: supplying direct current (DC) to a coil of an electromagnetic transducer provided in a magnetic head for writing data onto a magnetic recording medium; measuring an inductance of the electromagnetic transducer at each current value while varying the current value of the direct current; and investigating behavior of magnetic domains in a magnetic core of the electromagnetic transducer based on a relationship between the current values and the inductances. Further, according to the present invention, a testing method of a magnetic head is provided, the method comprising: evaluating whether writing performance of the magnetic head is good or not, based on a relationship between the current values and the inductances.

According to the method for investigating magnetic domains of the invention, application of an external magnetic field is not necessary, so that behavior of the magnetic domains can be easily investigated. According to the testing method of the invention, measurement of inductances can be performed without application of an external magnetic field to an electromagnetic transducer. Moreover, the writing performance of the magnetic head can be easily evaluated without actual writing operation onto the magnetic recording medium.

It is preferable that the magnetic head as an evaluation object is evaluated to be bad when hysteresis exceeding a predetermined reference level is found in the relationship between the current values and the inductances. Further, it is preferable that the magnetic head as an evaluation object is evaluated to be bad when a hysteresis area ratio is 8% or more. Particularly, use of the HAR allows evaluation of a head BER without measuring its BER.

Furthermore, according to the above-mentioned testing method of the invention, as testing condition, it is preferable that the above-mentioned DC current values are continuously varied in the range of two current values, each having enough value to cause the hysteresis in behavior of magnetic domains of a magnetic core in the electromagnetic transducer. In this case, it is preferable that the two current values are −80 mA or less and +80 mA or more, respectively. Further, it is preferable that the measurement of the inductances is carried out by using alternating current (AC) having a frequency of at least 50 MHz.

Furthermore, it is preferable that the measurement of the inductances is carried out by using an impedance analyzer with the direct current supplied by using a DC power source. In this case, it is also preferable that supplying direct current to the electromagnetic transducer from the DC power source and supplying alternating current to the electromagnetic transducer from the impedance analyzer are carried out through a bias tee.

Furthermore, according to the present invention, a manufacturing method of a magnetic head is provided, the method comprising: supplying direct current (DC) to a coil of an electromagnetic transducer, the transducer being formed on a substrate wafer when magnetic-head patterns are formed on the substrate wafer, or formed on a row bar when the substrate wafer is cut and separated into the row bars, or formed on a slider when the row bar is cut and separated to obtain the slider; measuring an inductance of the electromagnetic transducer at each current value while varying the current value of the direct current; evaluating whether writing performance of the magnetic head is good or not, based on a relationship between the current values and the inductances; and selecting a good product.

According to the manufacturing method of a magnetic head, it can be evaluated prior to mounting the magnetic head on a suspension to assemble an HGA whether the writing performance of the magnetic head is good or not, and a good magnetic head can be selected. With this method, the yield of whole HGA can be improved without increasing disposal of value-added HGAs. Moreover, because of a simple test, execution of such a test does not require spending time and labor so much.

Further objects and advantages of the present invention will be apparent from the following description of preferred embodiments of the invention as illustrated in the accompanying drawings. Some elements have been designated with same reference numerals in the different drawings.

BRIEF DESCRIPTION OF THE SEVERAL VIEWS OF THE DRAWINGS

FIGS. 3a to 3c2 are graphs showing test examples in which inductances of the electromagnetic transducer were measured using the testing apparatus shown in FIG. 1;

FIG. 4 is a flowchart schematically showing one embodiment of a manufacturing method of a thin-film magnetic head by using the testing method according to the present invention;

FIGS. 7a to 7c are graphs showing test examples in which inductances of the electromagnetic transducer were measured using the testing apparatus shown in FIG. 1;

DETAILED DESCRIPTION OF THE INVENTION

Figure 1:
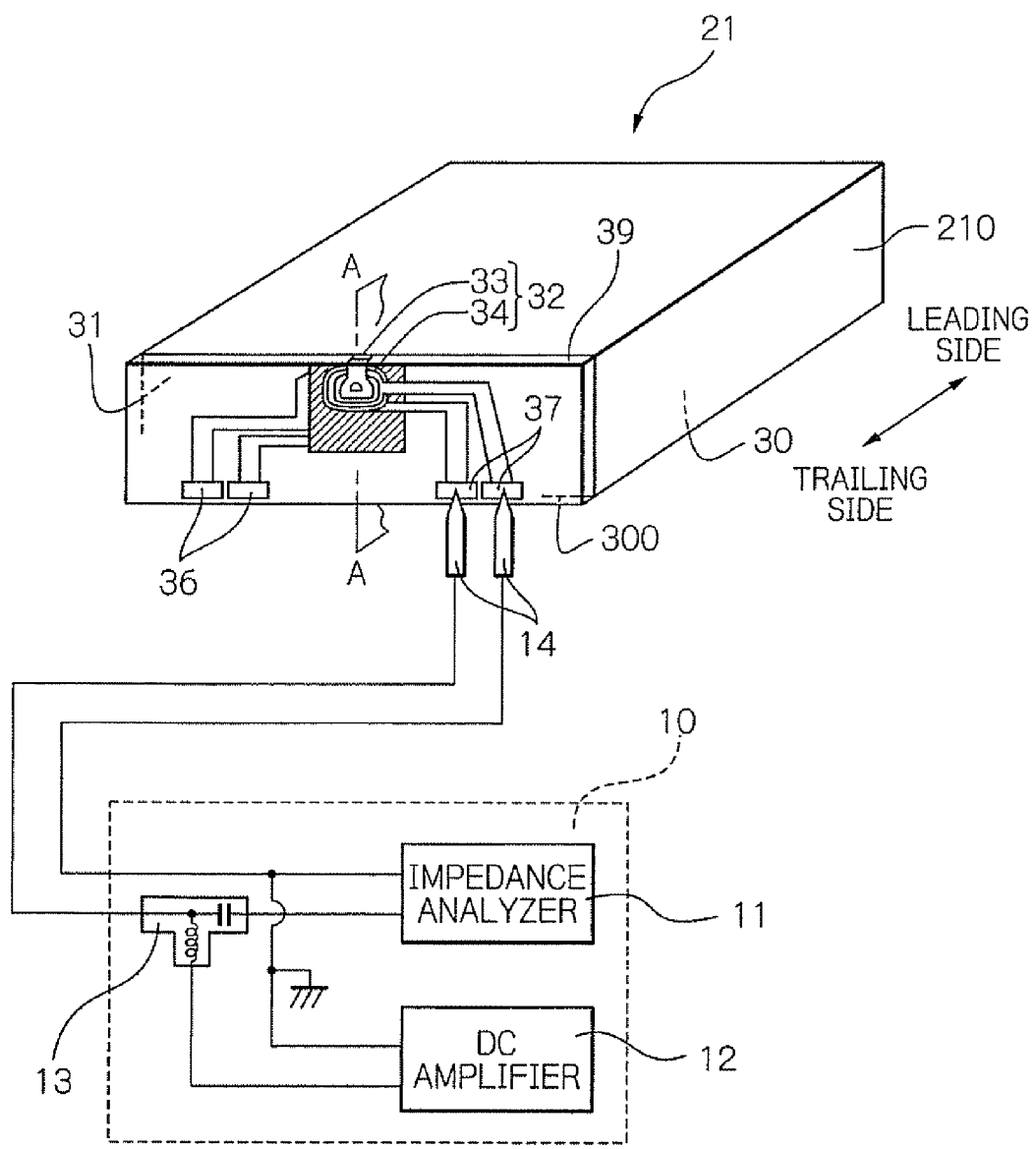
FIG. 1 is a schematic diagram showing one embodiment of a testing apparatus and a thin-film magnetic head used for performing a testing method of a magnetic head according to the present invention.

FIG. 1 is a schematic diagram showing one embodiment of a testing apparatus and a thin-film magnetic head used for performing a testing method of a magnetic head according to the present invention.

Referring to FIG. 1, a thin-film magnetic head 21 for use in a magnetic disk device includes a head substrate 210 having an air bearing surface (ABS) 30 machined so as to obtain a appropriate flying height, a head element 32 provided on an element-formed surface 31 of the head substrate 210, an overcoat layer 39 provided on the element-formed surface 31 to cover the head element 32, and two pairs of terminal electrodes 36 and 37 exposed from a layer surface of the overcoat layer 39. The head element 32 has an MR effect element 33 that is a read head element for reading data signals, and an electromagnetic transducer 34 that is a write head element for writing data signals. The terminal electrodes 36 and 37 are electrically connected to these MR effect element 33 and electromagnetic transducer 34. When the thin-film magnetic head 21 is mounted on a magnetic disk device, the thin-film magnetic head 21 is first fixed on one end of a suspension, and then forms a head gimbal assembly (HGA) with a wiring member arranged. This HGA is attached to a driving arm in the magnetic disk device so that the thin-film magnetic head 21 opposes to the surface of a magnetic disk.

In the MR effect element 33 and the electromagnetic transducer 34, one end of each element reaches a head-end surface 300. Here, the head-end surface 300 is a surface excluding the ABS 30 out of a medium-opposing surface, opposing to the magnetic disk, of the thin-film magnetic head 21, and is chiefly composed of the end surface of the overcoat layer 39. Thus, one end of these elements faces the magnetic disk, whereby the head can read data by sensing signal magnetic fields and write data by applying signal magnetic fields. Incidentally, an object, to which the testing method of the invention is applicable, is not limited to the thin-film magnetic head for use in a magnetic disk device as described above, but can be, for example, a tape head as long as the head has an electromagnetic transducer provided with a coil and a magnetic core for writing data.

Referring to the same drawing FIG. 1, a testing apparatus 10 includes an impedance analyzer 11 for measuring inductance of the electromagnetic transducer 34, a DC power source 12 for supplying DC current to the coil of the electromagnetic transducer 34, and a bias tee 13 for connecting each of the impedance analyzer 11 and the DC power source 12 to a pair of probes 14.

The impedance analyzer 11 supplies high-frequency alternating current to the electromagnetic transducer 34 through the terminal electrodes 37 for the electromagnetic transducer 34, the electrodes 37 being in contact with the probes 14, and measures the inductance of the electromagnetic transducer 34. The bias tee 13 is a branch consisting of combination of a coil and a capacitor, and passes the DC current from the DC power source 12 together with the AC from the impedance analyzer 11 toward the electromagnetic transducer 34, while preventing the DC component out of an output signal from the electromagnetic transducer 34 from going to the impedance analyzer 11.

In the test of a head, there is supplied first to the coil in the electromagnetic transducer 34, direct current from the DC power source 12 (DC bias current) and further the high-frequency AC for measuring inductance from the impedance analyzer 11. That is, both the DC bias current from the DC power source 12 and the high-frequency AC for measuring inductance from the impedance analyzer 11 are fed through the coil of the electromagnetic transducer 34. Next, while the value of the DC bias current is varied within a predetermined rage, the inductances of the electromagnetic transducer 34 are measured for each current value by using the impedance analyzer 11. The testing method of the invention does not require application of an external magnetic field that is necessitated in Japanese Patent Publication No. 03-132911A. Resultantly, it is not necessary to prepare Helmholtz coils for applying the magnetic field and a power source for it, which allows the test to be performed simply. Finally, according to a relationship between the current values and the inductances thus obtained, it is evaluated whether the writing performance of the thin-film magnetic head 21 is good or not. When evaluating the performance, if hysteresis exceeding a predetermined reference level is found in the obtained relationship between the current values and the inductances, the magnetic head as an evaluation object can be evaluated to be bad. This evaluation criterion will be explained later in detail by using examples.

As described above, according to the testing method of the invention, the writing performance of the thin-film magnetic head 21 can be simply evaluated without actual operation of writing onto a magnetic recording medium. Accordingly, this testing method is also applicable to heads during manufacturing thereof as will be explained later in detail.

Figure 2A:
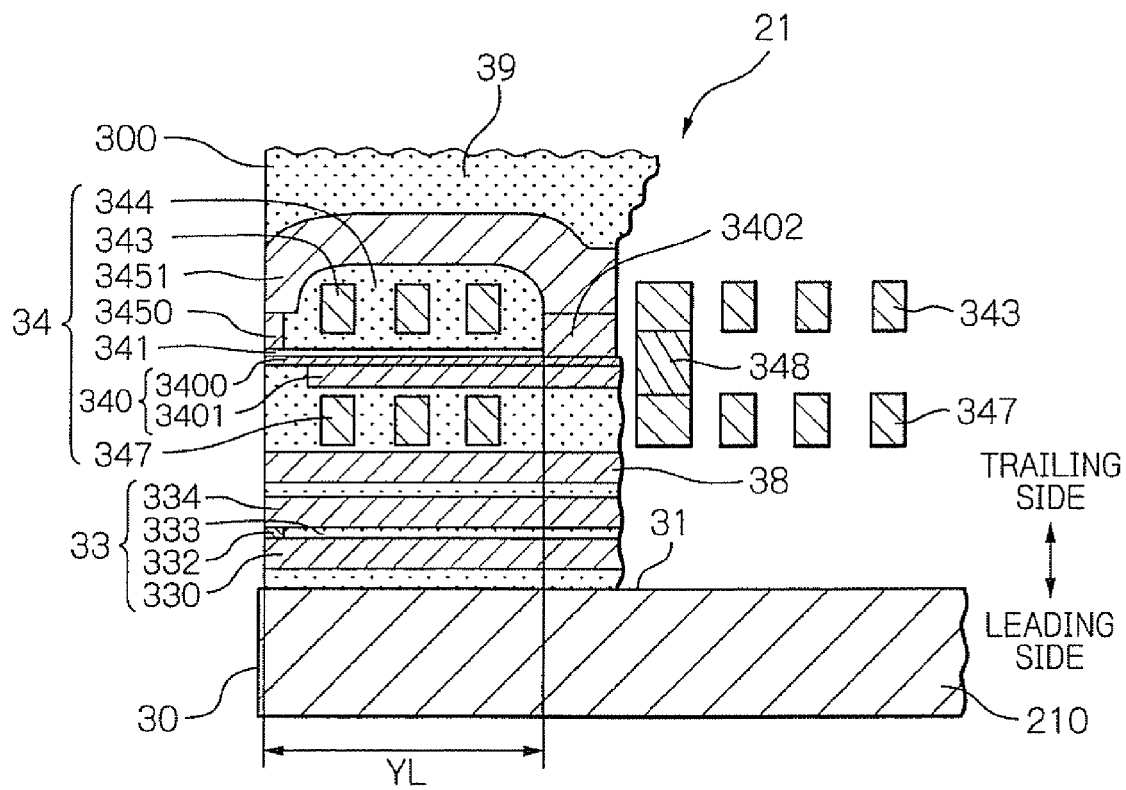
FIG. 2a is a cross-sectional view taken on the surface A of FIG. 1, schematically showing the structure of main parts of the thin-film magnetic head that is an object to be tested.
Figure 2B:
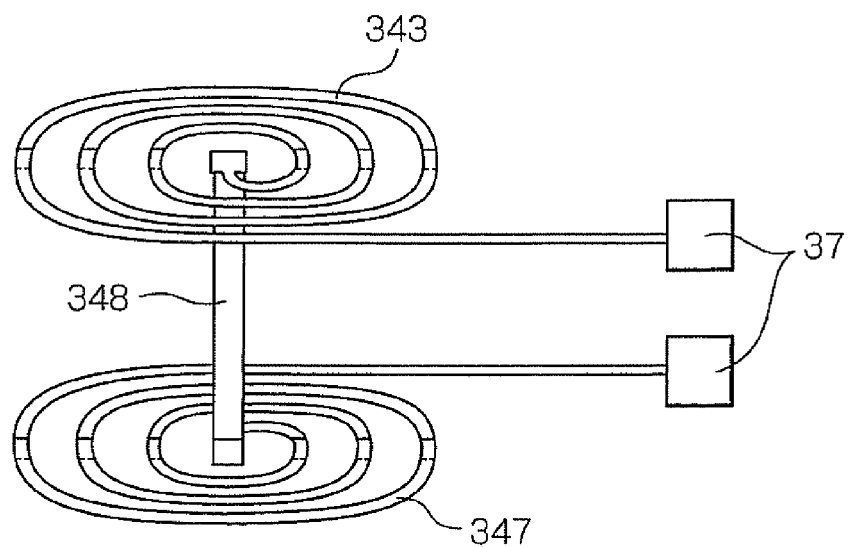
FIG. 2b is a schematic diagram showing the wiring of a write coil layer and a backing coil layer.

FIG. 2a is a cross-sectional view taken on the surface A of FIG. 1, schematically showing the structure of main parts of the thin-film magnetic head 21 that is an object to be tested. FIG. 2b is a schematic diagram showing the wiring of a write coil layer 343 and a backing coil layer 347.

Referring to FIG. 2a, the MR element 33 is a tunnel magnetoresistive effect element (TMR element), a current-perpendicular-to-plane giant magnetoresistive effect element (CPP-GMR element) or a current-in-plane giant magnetoresistive effect element (CIP-GMR element), and is formed on an element-formed surface 31 of the slider substrate 210 via an insulating layer formed of insulating material such as $Al_2O_3$ (alumina). The MR element 33 includes a MR stacked body 332, a shield gap layer 333 formed of insulating material such as $Al_2O_3$ (alumina) so as to enclose at least a back of the stacked body, a lower shield layer 330 and an upper shield layer 334 arranged in positions sandwiching the MR stacked body 332 and the shield gap layer 333. The MR stacked body 332 is a magnetic field sensing part that senses signal magnetic fields from a magnetic disk with very high sensitivity and outputs in the form of electric-resistance changes (voltage changes).

The upper and lower shield layers 334 and 330 function as shielding parts preventing the stacked body 332 from receiving magnetic fields that may cause noise, and also act as electrodes for applying sense current to the MR stacked body 332 in a direction perpendicular to the stacked surface when the MR element 33 is a TMR element. Whereas, when the MR element 33 is a CIP-GMR element, shield gap layers formed of insulating material are provided in respective positions between each of the upper and lower shield layers 334 and 330 and the stacked body 332, and further a lead conductive layer formed of conductive material is provided for supplying sense current to the MR stacked body 332.

Referring to the same drawing FIG. 2a, the electromagnetic transducer 34 is for perpendicular magnetic recording in the present embodiment, and includes main magnetic pole layer 340, gap layer 341, write coil layer 343, trailing shield 3450, write shield layer 3451, back contact layer 3402, and backing coil layer 347. Here, the write coil layer 343 and the backing coil layer 347 constitute a coil, and the main magnetic pole layer 340, the trailing shield 3450, the write shield layer 3451 and the back contact layer 3402 constitute a magnetic core.

The main magnetic pole layer 340 is a magnetic path for converging and guiding the magnetic flux, which is generated with write current applied to the write coil layer 343, to a magnetic recording layer of the magnetic disk to be written thereon. The main magnetic pole layer 340 has a two-layer structure in which a main pole body part 3401 and a main magnetic pole 3400 are sequentially stacked and magnetically connected to each other. Out of these layers, the main magnetic pole 3400 reaches a head end surface 300, and has a tip portion with a minute width in a track-width direction. This minute width of the tip portion regulates the track width formed on the magnetic recording layer. The main magnetic pole 3400 is formed of soft magnetic material having higher saturation magnetic flux density than that of the main pole body part 3401, the soft magnetic material being, for example, ferrous alloy containing Fe as its main constituent, such as FeNi, FeCo, FeCoNi, FeN or FeZrN. The thickness of the main magnetic pole 3400 is, for example, around 0.2-0.5 μm (micrometer).

The gap layer 341 is a gap formed for magnetically separating the main magnetic pole layer 340 from the trailing shield 3450 at the vicinity of the head end surface 300. The gap layer 341 has a thickness of, for example, around 0.01-0.1 μm, and is formed of nonmagnetic insulating material, such as $Al_2O_3$ (alumina), $SiO_2$ (silicon dioxide), AlN (aluminum nitride) or diamond like carbon (DLC), or nonmagnetic conductive material such as Ru (ruthenium).

The write coil layer 343 is formed so as to pass at least a space between the main magnetic pole layer 340 and the write shield layer 3451 during one turn of winding, and has a spiral structure wound around the back contact part 3402 positioned at the center. The write coil layer 343 is formed of conductive material such as Cu (copper), and has a thickness of, for example, around 0.3-5 μm. Here, a coil-insulating layer 344, formed of insulating material such as heat-cured photo-resist, covers the write coil layer 343 to electrically insulate the write coil layer from the main pole layer 340 and the write shield layer 3451. The write coil layer 343 is a monolayer in the embodiment, however may have two or more layers or be a helical coil. Moreover, the number of turns is not limited to that shown in FIG. 2, and may be any of 2-7 turns.

The trailing shield 3450 reaches the head end surface 300, and has a larger width in the track-width direction than that of the tip of the main magnetic pole 3400 as well as the main magnetic pole body part 3401. The trailing shield 3450 is provided for taking in the flux originated and diverged from the main magnetic pole layer 340. With this structure, a magnetic field gradient is caused to be steeper at the position between the end portion of the trailing shield 3450 and the top of the main magnetic pole 3400. As a result, a jitter of signal outputs becomes smaller, and an error rate during reading can be reduced. The write shield layer 3451 also reaches the head end surface 300 to be connected to the trailing shield 3450, and acts as a magnetic path for not only the flux taken in by the trailing shield 3450 but also the flux returned from a backing layer of soft magnetic material in the magnetic disk. The trailing shield 3450 and the write shield layer 3451 are formed of soft magnetic material, and particularly, the trailing shield 3450 is preferably formed of NiFe (permalloy) having high saturation magnetic flux density or of the same ferrous alloy material as that used in the main pole 3400.

The backing coil layer 347 is a coil for negating a magnetic flux loop coming through the upper and lower shield layers 334 and 330 in the MR element 33, the loop originating from the write coil layer 343 of the electromagnetic transducer 34 depending on the write current applied thereto. That is, the backing coil layer 347 generates magnetic flux to negate such magnetic flux loop to achieve suppression of unnecessary writing of data onto the magnetic disk or unnecessary erasing of data on the magnetic disk. The backing coil layer 347 in the embodiment, as shown in FIG. 2b, has the same spiral structure as in the write coil layer 343 with the wounded direction reversed to that of the write coil layer 343. Moreover, the backing coil layer 347 and the write coil layer 343 are connected in series to each other with a connection part 348. Therefore, the write current can be supplied to both layers through two terminal electrodes 37 (FIG. 2b). The backing coil layer 347 is a monolayer in the embodiment, however may have two or more layers or be a helical coil. Moreover, the number of turns is not limited to that shown in FIG. 2, and may be any of 2-7 turns in coincidence with that of the write coil layer 343.

In the present embodiment, an inter-element shield layer 38 is provided between the MR element 33 and the electromagnetic transducer 34. The inter-element shield layer 38 plays the role of shielding the MR element 33 from the magnetic field generated from the electromagnetic transducer 34, and may be formed of the same soft magnetic material as in the upper and lower shield layers 334 and 330, having a thickness of, for example, around 0.5-5 µm. The electromagnetic transducer 34 described above is for perpendicular magnetic recording, however a head for longitudinal magnetic recording, which has upper and lower magnetic pole layers as a magnetic core and a write coil layer, can be also an object to be tested of the present invention. Moreover, a head, in which the electromagnetic transducer 34 does not have the backing coil layer 347 and only write coil layer 343 constitutes a coil, can be also an object to be tested of the present invention.

FIGS. 3a to 3c2 are graphs showing test examples in which inductances of the electromagnetic transducer 34 were measured using the testing apparatus shown in FIG. 1.

FIG. 3a shows a measured result of the inductances in the electromagnetic transducer 34 of the thin-film magnetic head 21. The abscissa of the graph indicates values (unit is mV) of current (DC bias current) supplied from the DC power source 12 to the electromagnetic transducer 34, and the ordinate indicates measured values (unit is nH) of the inductances. In the graph, an UP curve corresponds to a case that the values of DC bias current are continuously varied from −100 mA to +100 mA, and a DOWN curve a case that the values of DC bias current are continuously varied from +100 mA to −100 mA. Here, a plus direction of the DC bias current is defined as a direction that the current flows from the write coil layer 343 to the backing coil layer 347 in FIG. 2b, and a minus direction of the DC bias current is the reverse one. In measuring the inductances, high-frequency AC current having a frequency of 50 MHz was supplied to the electromagnetic transducer 34 as the current for measuring the inductance using the impedance analyzer 11. The amplitude of the high-frequency AC current was 1 mA.

Referring to FIG. 3a, both of the UP curve and the DOWN curve of inductances have their peaks when the DC bias current value is around zero, and have lower slopes at around +50 to +100 mA and −50 to −100 mA. This decrease of inductances depending on the increase of absolute values of the DC bias current is caused such that, when the current value is increased with the current fed through the coil, magnetization of the magnetic core gets gradually saturated to one direction and permeability µ is reduced. When the DC bias current values are around +100 mA and −100 mA, the magnetization of the magnetic core is almost saturated and the inductance of a coil only is presented. Incidentally, as described above, in the thin-film magnetic head 21 (FIG. 2), the write coil layer 343 and the backing coil layer 347 constitute the coil, and main magnetic pole layer 340, trailing shield 3450, write shield layer 3451 and back contact layer 3402 constitute the magnetic core.

Furthermore, referring to FIG. 3a, the UP curve and the DOWN curve do not lie one upon another, for example, a difference $h_I$ in inductance values between the UP curve and the DOWN curve occurs at −30 mA of DC bias current value. In other words, there is found such a phenomenon, namely, hysteresis that different inductance values are exhibited at the same DC bias current value between one case of continuously varying the DC bias current from −100 mA to +100 mA and the other case of continuously varying from +100 mA to −100 mA. The existence of this hysteresis in inductance indicates that the permeability µ of the magnetic core in a high-frequency area changes according to a direction of magnetic flux (magnetic field) applied to the magnetic core. This exactly reflects the hysteresis of behavior of magnetic domains in the magnetic core formed of soft magnetic material. It is generally known that the hysteresis of behavior of magnetic domains occurs due to abnormal movement of magnetic domains chiefly caused by domain-wall movement, which is undesirable for write characteristics of the electromagnetic transducer 34.

The inventors of the present invention, after measuring respective relationship between DC bias currents and inductances in the electromagnetic transducers 34 for various heads, wrote data on a magnetic disk by using these electromagnetic transducers 34, and measured bit error rates (BER) when the written data are read by using an MR element 33. Here, the BER is defined with the steps of writing predetermined number of bits onto a medium, reading the written bits, and obtaining a ratio of the number of error bits out of the read bits to the firstly used predetermined number.

As a result, it was found that a correlation exists between BERs and abnormality in behavior of magnetic domains of magnetic cores, that is, writing performance was reduced in a head having a higher value of BER than a determination reference level, and in this case, hysteresis exceeding a reference level was observed in the inductance of the electromagnetic transducer 34. A detail description will be given of the result of this measurement and observation according to test examples described with reference to Tables 1 and 2, FIGS. 6a to 6c, FIGS. 7a to 7c and FIG. 9. Incidentally, as a determination reference level of BER, $1 \times 10^{-4}$ is generally used in head manufacturing sites as a value before error correction. That is, if a BER is larger than $1 \times 10^{-4}$, then the head is determined to be bad with respect to the BER.

From the foregoing, it is understood that behavior of magnetic domains in the magnetic core of the electromagnetic transducer 34 can be investigated according to the above-described method with use of the testing apparatus shown in FIG. 1. Observation of magnetic domains in the magnetic core has required consumption of a lot of time and labor in the past, because a large-scale domain observation apparatus is necessitated. Whereas, the method described above does not require application of an external magnetic field, which allows simple investigation of the behavior of magnetic domains. Furthermore, it is possible to evaluate whether the thin-film magnetic head 21 is good or not, according to determination as to whether the above-described hysteresis exceeds a predetermined reference level. This evaluation method will be described later in detail using test examples.

Next, measurement conditions for measuring inductances in the above-described testing method (evaluation method) of the present invention will be considered.

FIGS. 3b1 and 3b2 show examples of measured inductances when the DC bias current is varied in the range from −70 to +70 mA and from −80 to +80 mA, respectively, in one head sample (BER=$10^{-3.2}$) determined to be bad with respect to the BER. The frequency of current for measuring inductances was 50 MHz in both cases.

While hysteresis of inductances is hardly found for this head sample in FIG. 3b1, hysteresis of inductances is clearly observed for the same head sample in FIG. 3b2. This means that the hysteresis of inductances cannot be observed in some cases if a varied range of the applied DC bias current is not wide enough. Accordingly, it is understood that the DC bias current has to be varied in the range at least from −80 to +80 mA in order to securely catch the behavior of magnetic domains of a magnetic core which may bring a problem. That is, by continuously varying the DC bias current in the range from a current value of −80 mA or less to a current value of +80 mA or more, it becomes possible to securely catch the behavior of magnetic domains of a magnetic core in which a problem may arise.

FIGS. 3c1 and 3c2 show examples of measured inductances when the frequency of current for measuring inductances is set to 10 MHz and 50 MHz, respectively, in one head sample (BER=$10^{-2.5}$) determined to be bad with respect to BER. The DC bias current is varied in the range from −100 to +100 mA in both cases.

While hysteresis of inductances is hardly found for this head sample in FIG. 3c1, hysteresis of inductances is clearly observed for the same head sample in FIG. 3c2. This means that the hysteresis of inductances cannot be observed in some cases if the frequency of current for measuring inductances is not high enough. Accordingly, it is understood that the frequency of current for measuring inductances has to be set to at least 50 MHz in order to securely catch the behavior of magnetic domains of a magnetic core in a high-frequency area which may bring a problem. That is, by setting the frequency of current for measuring inductances to 50 MHz or more, it becomes possible to securely catch the behavior of magnetic domains of a magnetic core in a high-frequency area which may bring a problem.

Figure 5A:
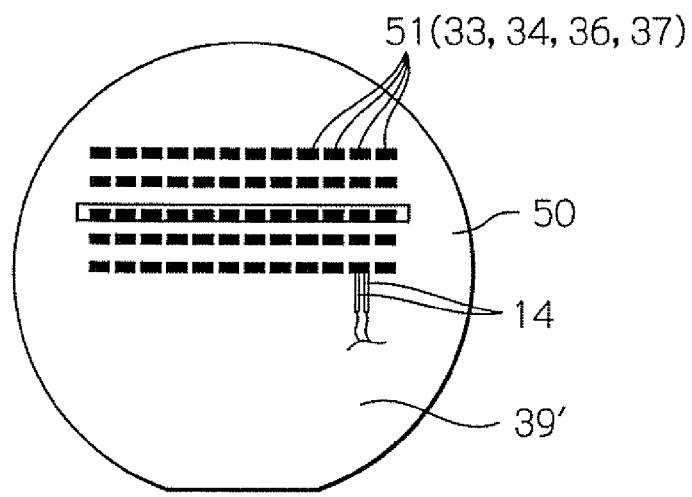
FIGS. 5a to 5c are schematic diagrams showing states of using the testing probes at respective steps of the manufacturing process.
Figure 5B:
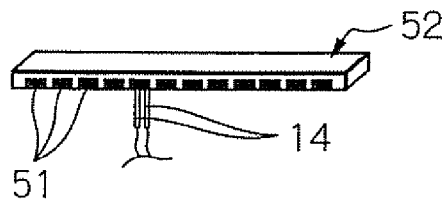
Figure 5C:
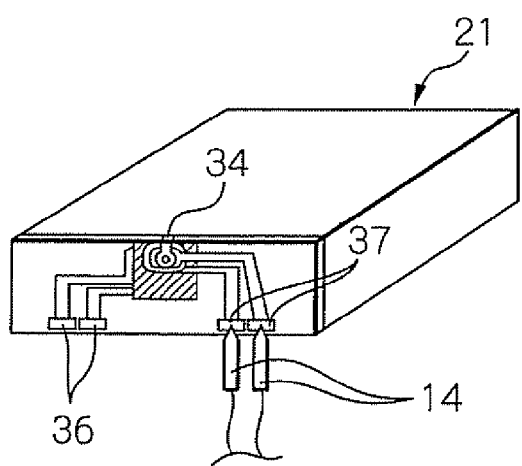

FIG. 4 is a flowchart schematically showing one embodiment of a manufacturing method of a thin-film magnetic head by using the testing method according to the present invention. Hereinafter, the manufacturing method will be described according to this flowchart, and an additional description will be given using FIGS. 5a to 5c if necessary. FIGS. 5a to 5c are schematic diagrams showing states of using the testing probes at respective steps of the manufacturing process.

Referring to FIG. 4, first, the MR elements 33 as read head elements are formed on an element-formed surface of a substrate wafer for sliders (step S1). Next, the electromagnetic transducers 34 as write head elements are formed (step S2). Thereafter, there are formed a overcoat film 39' to be the overcoat layer 39 for protecting these head elements and the terminal electrodes 36 and 37 electrically connected to these head elements (step S3). With these steps, a wafer thin-film process ends.

Referring to FIG. 5a, on a substrate wafer 50 after completion of the wafer thin-film process, there are arranged element patterns 51 in matrix, each pattern 51 having the MR element 33, the electromagnetic transducer 34, and the terminal electrodes 36 and 37. The test may be carried out by bringing the pair of probes 14 of the testing apparatus 10 shown in FIG. 1 into contact with the two terminal electrodes 37 for the electromagnetic transducer 34 in each element pattern 51 arranged in matrix (step $S_T4$). Then, based on a test result, element patterns, each including an electromagnetic transducer evaluated to be good, are selected as good patterns.

Referring back to FIG. 4, the wafer substrate after completion of the wafer thin-film process is adhered to a cut/separation jig with use of, e.g., resin, and cut into row bars in which a plurality of head elements are arranged in a row (step S5). Thereafter, the row bar is adhered to a lapping jig using, e.g., resin, and lapped as a MR height process to determine a position of ABS and a MR height (length of the MR stacked body in a direction perpendicular to the ABS) of the MR element 33 (step S6). Subsequently, a protective film is formed on a slider end surface at the ABS side of the row bar, to which the MR height process has been applied, with diamond like carbon (DLC), etc. for protecting the end of the head element (step S7). Then, the row bar, on which the protective film has been formed, is adhered to a rail forming jig using resin, etc. and is applied thereto a process for forming rails on the ABS side by using a photolithography method, ion beam etching method and the like (step S8).

Thereafter, test of the electromagnetic transducer 34 may be performed for the row bar to which the rail process has been applied (step $S_T9$). At this time, as shown in FIG. 5b, the test is performed by bringing the pair of probes 14 of the testing apparatus 10 shown in FIG. 1 into contact with the terminal electrodes 37 of the electromagnetic transducer 34 in each element pattern 51 arranged in a row in the row bar 52 to which the rail process has been applied. Then, based on a test result, element patterns, each including an electromagnetic transducer evaluated to be good, are selected as good patterns. Here, if the test at step $S_T4$ was performed previously, then the test of this step $S_T9$ can be omitted. It is also possible to perform the test of step $S_T9$ just after any one of steps S5, S6 and S7, but it is preferable to perform at least after step S6 in which machining strain affected by the MR height process may be given to the magnetic core.

Thereafter, referring back to FIG. 4, the tested row bar is adhered to a cutting jig using resin or the like, and after forming a grooves, the bar is cut and separated into individual sliders (thin-film magnetic heads) (step S10). With this, a machine process for forming sliders ends. Subsequently, the test of electromagnetic transducers 34 may be performed for each slider (step $S_T11$). At this time, as shown in FIG. 5c, the test is performed by bringing the pair of probes 14 of the testing apparatus 10 shown in FIG. 1 into contact with the terminal electrodes 37 of the electromagnetic transducer 34 in each slider 21. Then, based on a test result, sliders, each including an electromagnetic transducer evaluated to be good, are selected, and the selected sliders only are provided to advance to a next process. Incidentally, if the test at step $S_T4$ or step $S_T9$ has been performed previously, then the test of this step $S_T11$ can be omitted. In this case, sliders, each having an element pattern selected as a good one in a previous test, are selected, and the selected sliders only are provided to advance to a next process. With these steps described above, the manufacturing process of a thin-film magnetic head is completed.

Referring to FIG. 4, furthermore, the thin-film magnetic head fabricated according to the manufacturing method described above is mounted on a suspension (step S12) to assemble an HGA.

From the foregoing, in the manufacturing method of a thin-film magnetic head with use of the testing method according to the present invention, it can be evaluated prior to mounting the thin-film magnetic head on a suspension to assemble an HGA whether the writing performance of the thin-film magnetic head is good or not, and a good thin-film magnetic head can be selected. With this, the yield of whole HGA can be improved without increasing disposal of value-added HGAs. Moreover, because of a simple test, execution of such test does not spend time and labor so much.

Hereinafter, it will be proved by using examples for the testing method of a thin-film magnetic head according to the present invention that evaluation as to whether writing performance of the thin-film magnetic head is good or not, particularly whether the head is good or not with respect to BER.

[Explanation of Samples Used in Test Examples]

The thin-film magnetic heads 21 of the embodiment shown in FIGS. 2a and 2b were used as samples A, B and C of thin-film magnetic heads used in examples. Table 1 shows specifications of electromagnetic transducers 34 for the samples A, B and C. Here, a yoke length YL in Table 1 is, as shown in FIG. 2a, a distance in a direction perpendicular to the head end surface 300 between the end of the write shield layer 3451 at the head end surface 300 side and the end of the back contact layer 3402 at the head end surface 300 side. The number of samples was five for each of samples A, B and C.

TABLE 1

|  | YL (μm) | NUMBER OF TURNS IN COILS (WRITE + BACKING) | MATERIAL FOR TRAILIG SHIELD | MATERIAL FOR WRITE SHIELD LAYER |
| --- | --- | --- | --- | --- |
| SAMPLE A | 6 | 3 + 3 | $Fe_{50}Ni_{50}$ | $Fe_{50}Ni_{50}$ |
| SAMPLE B | 6 | 3 + 3 | $Fe_{53}Co_{35}Ni_{12}$ | $Fe_{50}Ni_{50}$ |
| SAMPLE C | 6 | 3 + 3 | $Fe_{53}Co_{35}Ni_{12}$ | $Fe_{18}Ni_{82}$ |

Referring to Table 1, for each of samples A, B and C, the yoke length YL was 6 μm, the number of turns of the write coil layer 343 was three, and that of the backing coil layer 347 was also three. However, combination of soft magnetic materials for forming the trailing shield 3450 and the write shield layer 3451 was different from each other.

[Test Conditions in Test Examples]

Test was carried out using the testing apparatus 10 shown in FIG. 1 for 5 heads of #1 to #5 in each of samples A, B and C (15 heads in total). The value of DC bias current supplied to the coil from the DC power source 12 was continuously varied from −100 mA to +100 mA, and further from +100 mA to −100 mA. In measurement of inductances, high-frequency AC having a frequency of 50 MHz was supplied to the electromagnetic transducer 34 as current for measuring inductances using the impedance analyzer 11. The amplitude of supplied high-frequency AC was 1 mA.

Test Examples

FIGS. 6a to 6c and FIGS. 7a to 7c are graphs showing test examples in which inductances of the electromagnetic transducer 34 were measured using the testing apparatus 10 shown in FIG. 1.

Figure 6B:
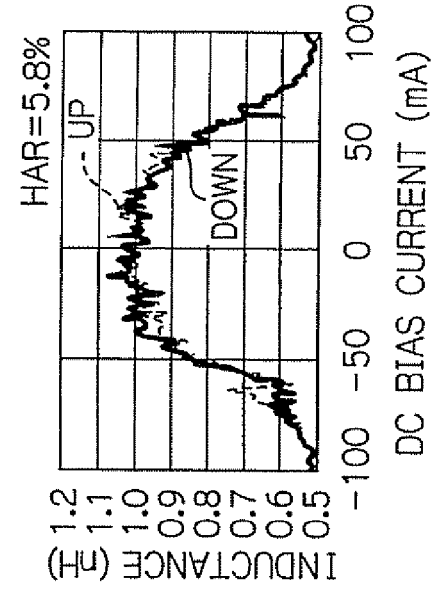
FIGS. 6a to 6c are graphs showing test examples in which inductances of the electromagnetic transducer were measured using the testing apparatus shown in FIG. 1.
Figure 6A:
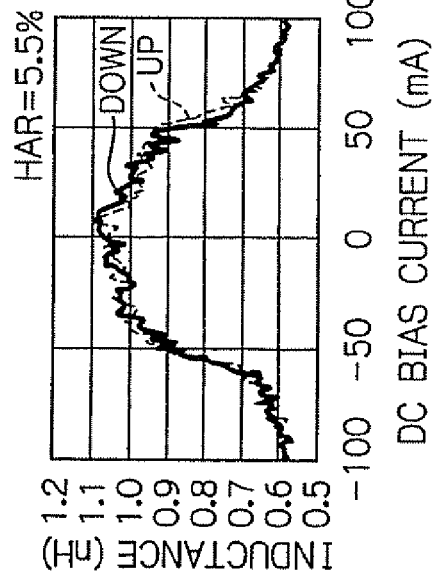
Figure 6C:
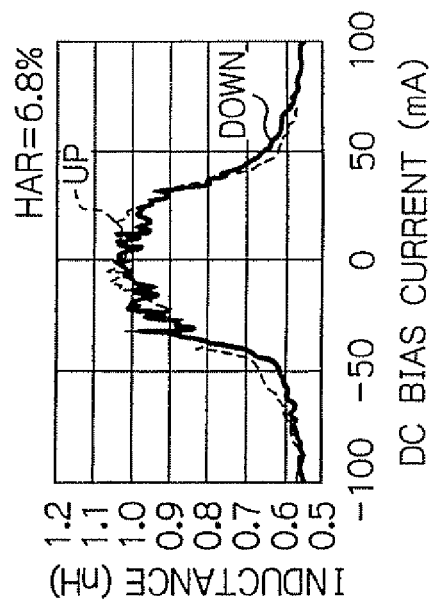

FIGS. 6a to 6c show, as test examples, respective relationships between DC bias currents and inductances in a #1 head of sample A, #1 head of sample B and #3 head of sample C. Hysteresis of inductance is hardly found in any heads. That is, FIGS. 6a to 6c are test-result examples of good heads.

On the other hand, FIGS. 7a to 7c show, as test examples, respective relationships between DC bias currents and inductances in a #5 head of sample C, #1 head of sample C and #3 head of sample B. Hysteresis of inductance is observed in any heads. That is, FIGS. 7a to 7c are test-result examples of bad heads. Thus, in any of samples A, B and C having various material structures in association with the trailing shield 3450 and the write shield layer 3451, there were found variations in relationships between DC bias currents and inductances, and the hysteresis of inductance was observed in some heads.

Next, by quantifying the hysteresis of inductance as found in FIGS. 7a to 7c, a criterion is to be determined for selecting a head having good writing performance with respect to a BER.

Figure 8:
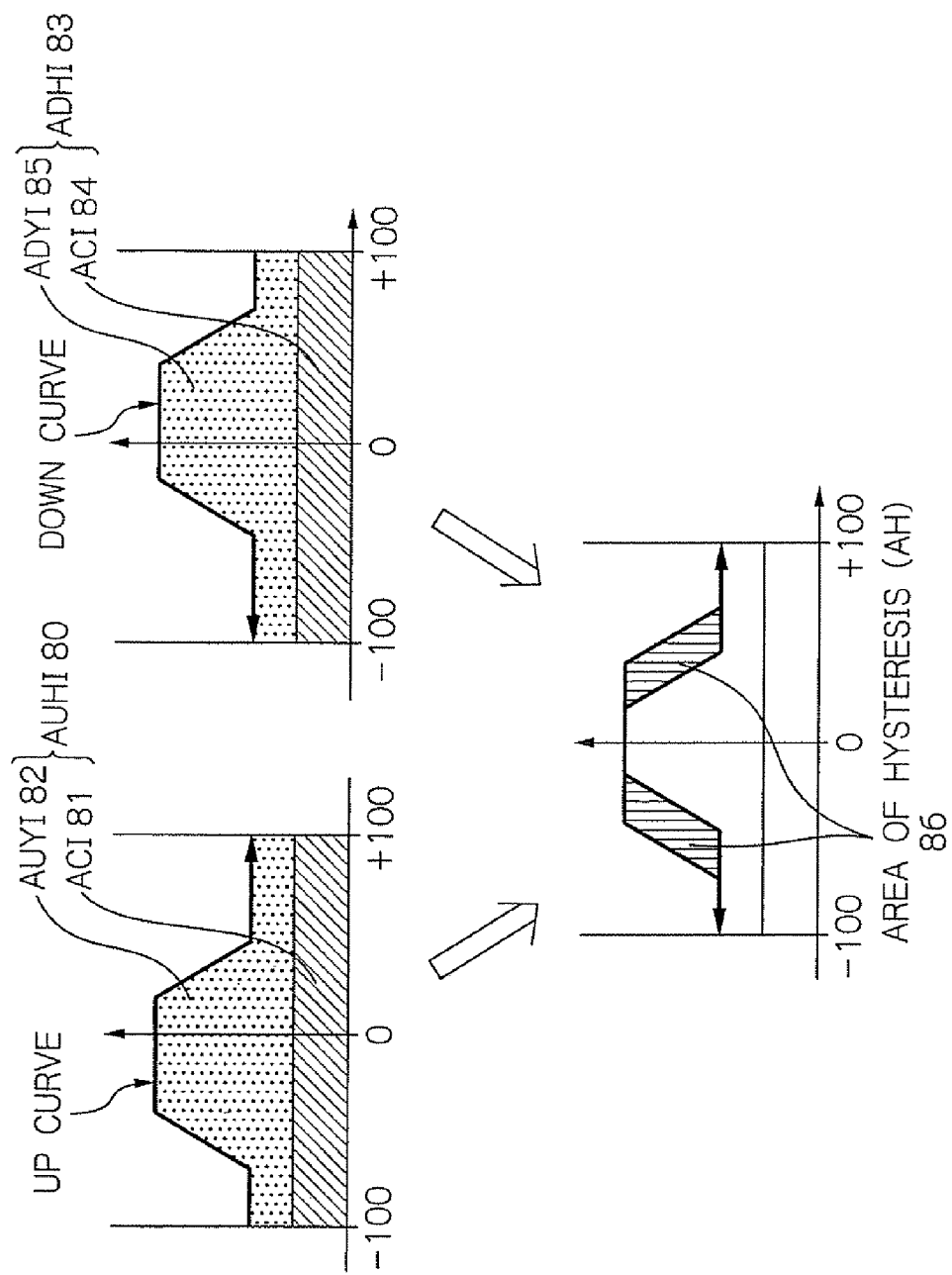
FIG. 8 is a series of schematic graphs for illustrating a hysteresis area ratio (HAR) that quantifies the hysteresis of inductance.

FIG. 8 is a series of schematic graphs for illustrating a hysteresis area ratio (HAR) that quantifies the hysteresis of inductance.

As shown in FIG. 8, an area formed between the UP curve and the abscissa is referred to as an area of UP head-inductance (AUHI) 80, the UP curve showing the relationship between the DC bias currents and the inductances when the DC bias current is continuously varied from −100 mA to +100 mA. Within the AUHI 80, an inductance portion due to the coil is referred to as an area of coil-inductance (ACI) 81, and a portion subtracted ACI 81 from the AUHI 80 is referred to as an area of UP yoke-inductance (AUYI) 82. That is, $$AUYI = AUHI - ACI. \tag{1}$$

On the other hand, similarly as shown in FIG. 8, an area formed between the DOWN curve and the abscissa is referred to as an area of DOWN head-inductance (ADHI) 83, the DOWN curve showing the relationship between the DC bias currents and the inductances when the DC bias current is continuously varied from +100 mA to −100 mA. Within the ADHI 83, an inductance portion due to the coil is referred to as an area of coil-inductance (ACI) 84, and a portion subtracted ACI 84 from the ADHI 83 is referred to as an area of DOWN yoke-inductance (ADYI) 85. That is, $$ADYI = ADHI - ACI. \tag{2}$$

Next, the hysteresis of inductance produced by the UP curve and the DOWN curve will be considered. Similarly, as shown in FIG. 8, an area 86 where the UP curve and the DOWN curve do not overlap each other is represented as an area of hysteresis (AH). Based on the above-described AUYI 82 and ADYI 85, an area of yoke-inductance (AYI) is defined as a mean value of both areas. That is, $$AYI=(AUYI+ADYI)/2. \tag{3}$$

Using the areas defined above, a hysteresis area ratio (HAR) will be defined as a quantified hysteresis of inductance. The HAR is defined as a ratio of the AH 86 to the AYI. That is, $$HAR=AH/AYI\times100(\%). \tag{4}$$

From expression (4), a larger HAR means a larger ratio of (area portion of) hysteresis, and therefore it is understood that the HAR can be a proper parameter representing hysteresis. Accordingly, using the HAR defined as above, the hysteresis of head inductance can be evaluated quantitatively.

Table 2 shows a measurement result of HARs and BERs for 5 heads of #1 to #5 in each of samples A, B and C (15 heads in total). In measurement of a BER, the measurement process includes measuring an HAR of each head, incorporating the measured head into an HGA, actually writing a predetermined number of bits onto a magnetic disk, reading the written bits, and calculating a ratio of the number of error bits out of the read bits to the firstly used predetermined number to obtain the BER. Here in Table 2, the measurement result is represented by its value of common logarithms $\log_{10}(BER)$. As described above, as a determination reference level of BER, BER=$1\times10^{-4}$ is generally used in head manufacturing sites as a value before error correction. That is, if a BER is larger than $1\times10^{-4}$, then the head is determined to be bad with respect to the BER.

TABLE 2

|  |  | #1 | #2 | #3 | #4 | #5 |
|---|---|---|---|---|---|---|
| SAMPLE A | HAR (%) | 5.5 | 6.8 | 7.6 | 6.2 | 7.0 |
|  | $\log_{10}(BER)$ | −4.9 | −5.5 | −4.3 | −4.6 | −4.9 |
| SAMPLE B | HAR (%) | 5.8 | 5.9 | 9.5 | 6.3 | 6.1 |
|  | $\log_{10}(BER)$ | −5.5 | −5.2 | −3.9 | −4.5 | −4.9 |
| SAMPLE C | HAR (%) | 15.3 | 11.4 | 6.8 | 14.4 | 13.1 |
|  | $\log_{10}(BER)$ | −3.2 | −2.5 | −4.5 | −2.8 | −1.8 |

According to Table 2, in samples A, all of samples #1 to #5 have a smaller value than −4 with respect to $\log_{10}(BER)$, that is, present a value less than $1\times10^{-4}$ with respect to the BER, and are determined to be good products with respect to the BER. In samples B, a sample #3 only has a value larger than −4 with respect to $\log_{10}(BER)$, that is, presents a value more than $1\times10^{-4}$ with respect to the BER, and is determined to be only one bad product. In samples C, a sample #3 only has a value smaller than −4 with respect to $\log_{10}(BER)$, that is, presents a value less than $1\times10^{-4}$ with respect to the BER, and is determined to be only one good product.

Figure 9:
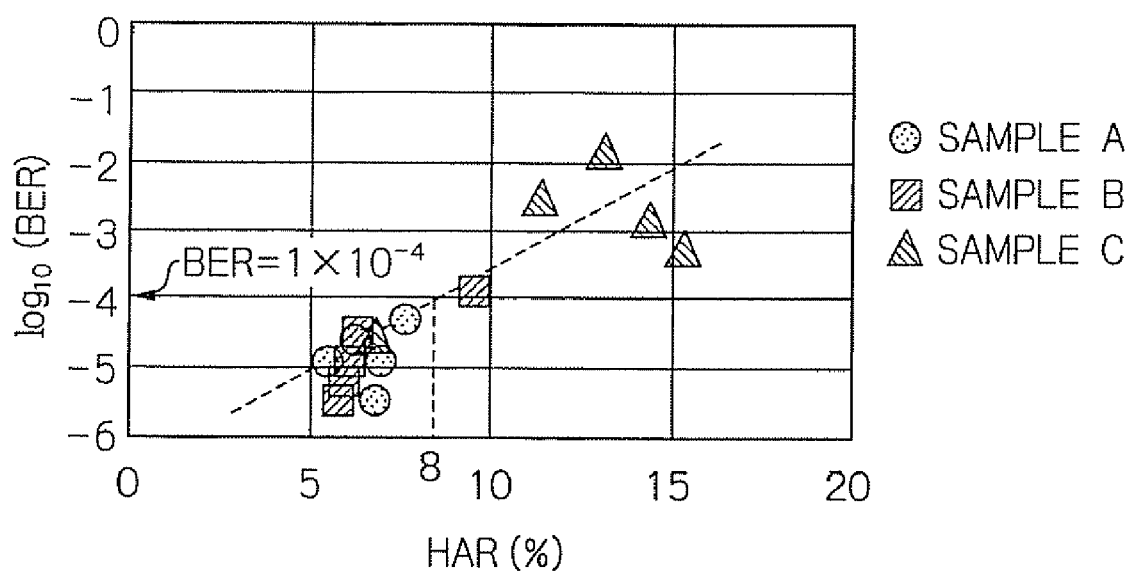
FIG. 9 is a graph showing a relationship between HARs and BERs in test examples shown in Table 2.

FIG. 9 is a graph showing a relationship between HARs and BERs in test examples shown in Table 2. In this graph, the abscissa indicates HARs in units of percent (%), and the ordinate common logarithms of BERs.

According to FIG. 9, a larger HAR value represents a larger BER in each head. That is, a larger hysteresis of inductance brings a more deteriorated BER. Thus, it is understood that a strong correlation exists between HARs and BERs. Therefore, use of the HAR allows evaluation of a head BER without measuring its BER. From the graph of FIG. 9, an HAR value corresponding to the determination reference level $1\times10^{-4}$ is 8.0%. Accordingly, when the HAR of a magnetic head is 8.0% or more, it can be determined that the head is bad with respect to the BER.

From the foregoing, in the testing method of a magnetic head according to the present invention, by measuring a relationship between DC bias currents and inductances for an electromagnetic transducer, it can be evaluated whether the head is good or not with respect to the BER, without spending time and labor for incorporating the head into an HGA and carrying out actual writing and reading.

All the foregoing embodiments are by way of example of the present invention only and not intended to be limiting, and many widely different alternations and modifications of the present invention may be constructed without departing from the spirit and scope of the present invention. Accordingly, the present invention is limited only as defined in the following claims and equivalents thereto.

The invention claimed is:

1. A method for investigating behavior of magnetic domains, the method comprising: supplying direct current (DC) to a coil of an electromagnetic transducer provided in a magnetic head for writing data onto a magnetic recording medium; measuring an inductance of the electromagnetic transducer at each current value while varying the current value of the direct current; and investigating behavior of magnetic domains in a magnetic core of the electromagnetic transducer based on a relationship between the current values and the inductances.

2. A testing method of a magnetic head, the method comprising: supplying direct current (DC) to a coil of an electromagnetic transducer provided in a magnetic head for writing data onto a magnetic recording medium; measuring an inductance of the electromagnetic transducer at each current value while varying the current value of the direct current; and evaluating whether writing performance of the magnetic head is good or not, based on a relationship between the current values and the inductances.

3. The testing method according to claim 2, wherein the measurement of the inductances is carried out in a state that an external magnetic field is not applied to the electromagnetic transducer.

4. The testing method according to claim 2, wherein, when hysteresis exceeding a predetermined reference level is found in the relationship between the current values and the inductances, the magnetic head as an evaluation object is evaluated to be bad.

5. The testing method according to claim 4, wherein, when a hysteresis area ratio is 8% or more in the relationship between the current values and the inductances, the magnetic head as an evaluation object is evaluated to be bad.

6. The testing method according to claim 4, wherein the DC current values are continuously varied in the range of two current values, each having enough value to cause the hysteresis in behavior of magnetic domains of a magnetic core in the electromagnetic transducer.

7. The testing method according to claim 6, wherein the two current values are −80 mA or less and +80 mA or more, respectively.

8. The testing method according to claim 4, wherein the measurement of the inductances is carried out by using alternating current (AC) having a frequency of at least 50 MHz.

9. The testing method according to claim 2, wherein the measurement of the inductances is carried out by using an impedance analyzer with the direct current supplied by using a DC power source.

10. The testing method according to claim 9, wherein supplying direct current to the electromagnetic transducer from the DC power source and supplying alternating current to the electromagnetic transducer from the impedance analyzer are carried out through a bias tee.

11. A manufacturing method of a magnetic head, the method comprising: supplying direct current (DC) to a coil of an electromagnetic transducer, the transducer being formed on a substrate wafer when magnetic-head patterns are formed on the substrate wafer, or formed on a row bar when the substrate wafer is cut and separated into the row bars, or formed on a slider when the row bar is cut and separated to obtain the slider; measuring an inductance of the electromagnetic transducer at each current value while varying the current value of the direct current; evaluating whether writing performance of the magnetic head is good or not, based on a relationship between the current values and the inductances; and selecting a good product.

12. The manufacturing method according to claim 11, wherein the measurement of the inductances is carried out in a state that an external magnetic field is not applied to the electromagnetic transducer.

13. The manufacturing method according to claim 11, wherein, when hysteresis exceeding a predetermined reference level is found in the relationship between the current values and the inductances, the magnetic head as an evaluation object is evaluated to be bad.

14. The manufacturing method according to claim 13, wherein, when a hysteresis area ratio is 8% or more in the relationship between the current values and the inductances, the magnetic head as an evaluation object is evaluated to be bad.

15. The manufacturing method according to claim 13, wherein the DC current values are continuously varied in the range of two current values, each having enough value to cause the hysteresis in behavior of magnetic domains of a magnetic core in the electromagnetic transducer.

16. The manufacturing method according to claim 15, wherein the two current values are −80 mA or less and +80 mA or more, respectively.

17. The manufacturing method according to claim 13, wherein the measurement of the inductances is carried out by using alternating current (AC) having a frequency of 50 MHz or more.

18. The manufacturing method according to claim 11, wherein the measurement of the inductances is carried out by using an impedance analyzer with the direct current supplied using a DC power source.

19. The manufacturing method according to claim 18, wherein supplying direct current to the electromagnetic transducer from the DC power source and supplying alternating current to the electromagnetic transducer from the impedance analyzer are carried out through a bias tee.

* * * * *